(12) United States Patent
Wachter

(10) Patent No.: US 7,875,928 B2
(45) Date of Patent: Jan. 25, 2011

(54) COMPONENT ARRANGEMENT HAVING AN EVALUATION CIRCUIT FOR DETECTING WEAR ON CONNECTIONS

(75) Inventor: Franz Wachter, Sattendorf (AT)

(73) Assignee: Infineon Technologies AG, Munich (DE)

( * ) Notice: Subject to any disclaimer, the term of this patent is extended or adjusted under 35 U.S.C. 154(b) by 355 days.

(21) Appl. No.: 11/190,497

(22) Filed: Jul. 27, 2005

(65) Prior Publication Data

US 2006/0027917 A1 Feb. 9, 2006

(30) Foreign Application Priority Data

Jul. 28, 2004 (DE) .................. 10 2004 036 520

(51) Int. Cl.
*H01L 23/48* (2006.01)
*H01L 23/495* (2006.01)
(52) U.S. Cl. ............... 257/341; 257/723; 257/724; 257/773; 257/E23.044
(58) Field of Classification Search ........... 257/728, 257/604, 723, 724, E23.037, E37.016
See application file for complete search history.

(56) References Cited

U.S. PATENT DOCUMENTS

| | | | |
|---|---|---|---|
| 4,931,844 A | 6/1990 | Zommer | |
| 5,281,872 A | 1/1994 | Mori | |
| 6,180,966 B1 | 1/2001 | Kohno et al. | |
| 6,366,770 B1 * | 4/2002 | Seshita et al. | 455/277.1 |
| 6,788,088 B2 * | 9/2004 | Throngnumchai | 324/763 |
| 7,126,354 B2 * | 10/2006 | Deboy et al. | 324/713 |
| 2006/0203400 A1 * | 9/2006 | Bodano et al. | 361/18 |

FOREIGN PATENT DOCUMENTS

| | | |
|---|---|---|
| DE | 4213606 A1 | 10/1992 |
| DE | 196 10 065 A1 | 9/1997 |
| DE | 102 11 831 A1 | 10/2003 |

OTHER PUBLICATIONS

"Smart Highside Power Switch", Infineon Technologies, Profet® BTS 307, Oct. 1, 2003, pp. 1-12 (12 pages).
Graf, Alfons, "Smart Power Switches for Automobile and Industrial Applications", Infineon Technologies AG, Munich, pp. 1-8 (8 pages).
"Smart High-Side Power switch Two Channels: 2×140 mΩ Status Feedback", Ifnineon Technolgies, BTS 5120L, pp. 1-14 (14 pages).

* cited by examiner

*Primary Examiner*—Zandra Smith
*Assistant Examiner*—Tsz K Chiu
(74) *Attorney, Agent, or Firm*—Maginot, Moore & Beck

(57) ABSTRACT

A component arrangement having an evaluation circuit for detecting wear on connections is disclosed. The component arrangement has the following features:
  a semiconductor body having at least one semiconductor component which is integrated in the semiconductor body and has at least one first connection zone,
  a first contact zone which is applied to the semiconductor body and contact-connects the at least one first connection zone in an electrically conductive manner,
  a contact element which is connected to the contact zone in an electrically conductive manner by means of at least one connection, the at least one contact zone having at least two contact zone sections which are arranged at a distance from one another and are each connected to the contact element in an electrically conductive manner by means of at least one connection, and an evaluation circuit being connected to the two contact zone sections.

18 Claims, 6 Drawing Sheets

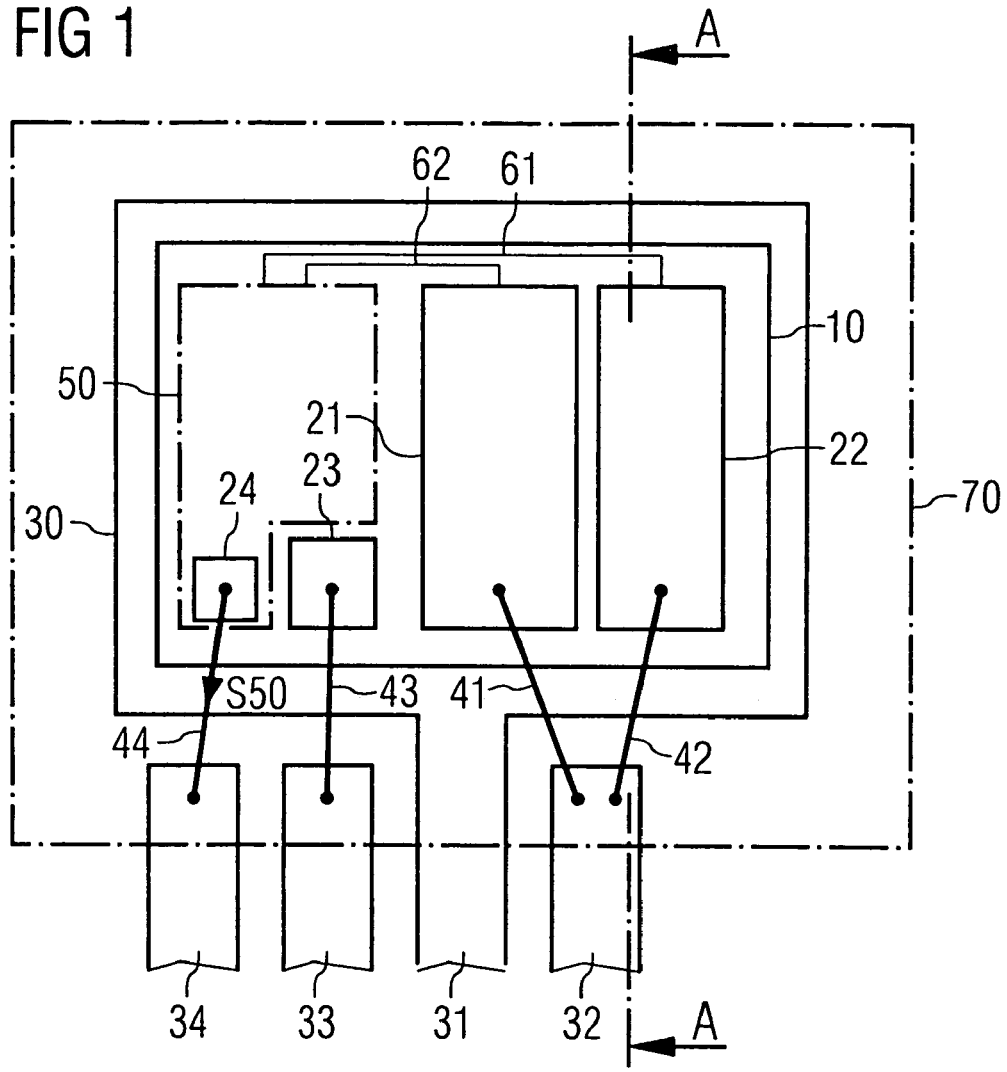
FIG 1
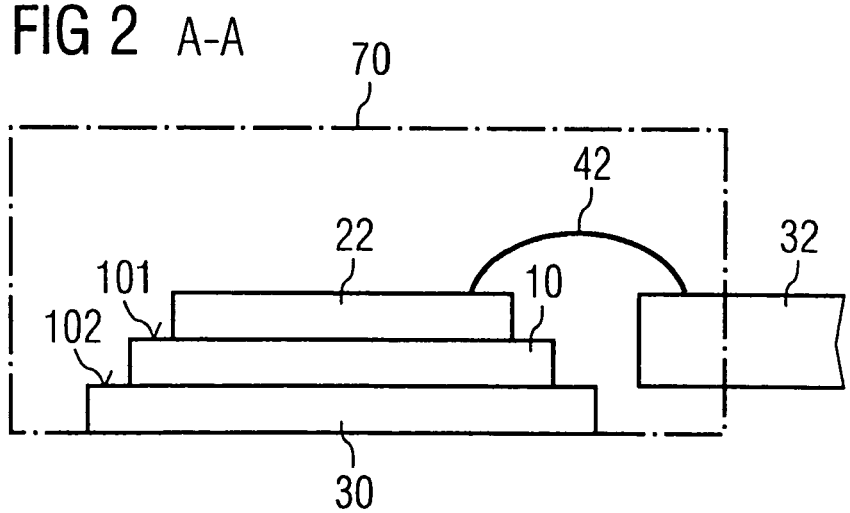
FIG 2 A-A

FIG 7
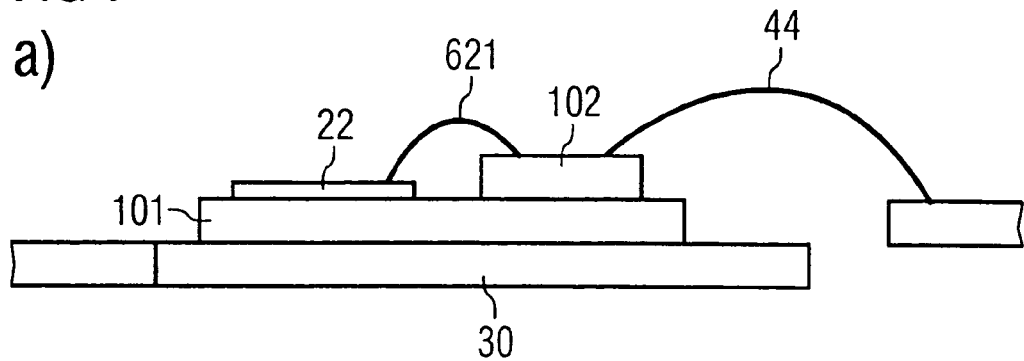
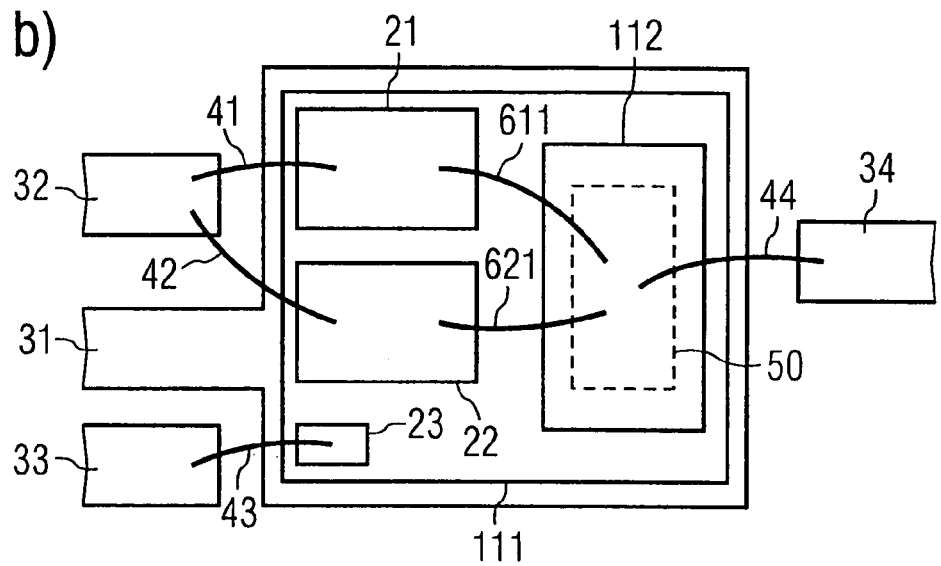
FIG 8
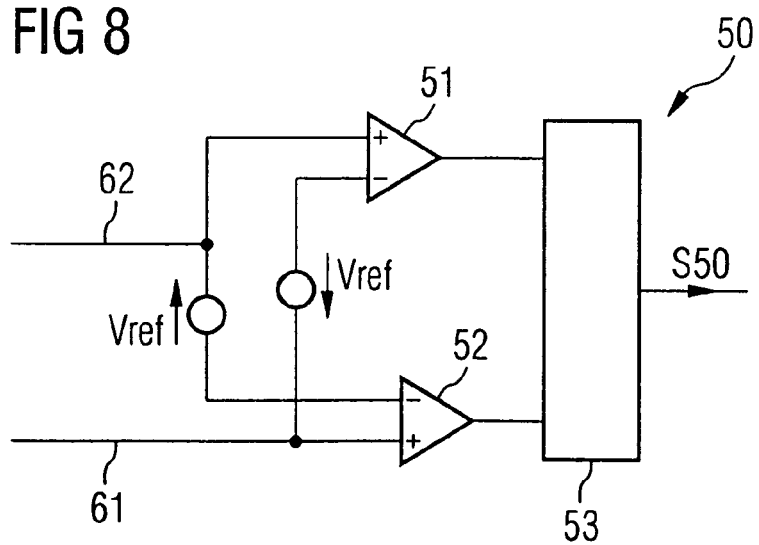

COMPONENT ARRANGEMENT HAVING AN EVALUATION CIRCUIT FOR DETECTING WEAR ON CONNECTIONS

FIELD OF THE INVENTION

The present invention relates to a component arrangement and in particular to a component arrangement having a semiconductor component which is integrated in the semiconductor body and is in the form of a power semiconductor component.

BACKGROUND

Power semiconductor components, for example power MOSFETs, power IGBTs, power diodes or power thyristors, are widely used to drive electronic loads. In this case, power MOSFETs, in particular, are used to switch electrical loads.

Such power MOSFETs which are suited to switching electrical loads are, for example, the power MOSFETs in the PROFET family from Infineon Technologies AG, Munich. In addition to the actual power component, these components also contain protective circuits for the power component in the same housing as the power component. These protective circuits may be monolithically integrated in the same semiconductor chip as the power component or may be integrated in a separate chip, which is applied to the power component's chip (chip-on-chip technology), and are used, for example, to protect the component from overtemperature, overvoltage or an excessively high load current. The design and operation of such "intelligent semiconductor switching elements" (smart power switches) are described, for example, in Graf, Alfons: "Smart Power Switches for Automobile and Industrial Applications", VDE, ETG Conference "Contact Performance and Switching", Karlsruhe, Sep. 26-28, 2001, or in the data sheets PROFET BTS307, 2003 Oct. 1, and BTS5210L, 2003 Oct. 1, from Infineon Technologies AG, Munich.

If such intelligent semiconductor switching elements are operated at load currents which are above the nominal current and which may arise, for example, if the connected load is shorted, the power loss which is converted into heat in the component rises. This results in an increase in temperature in the component, said increase resulting in a temperature protective circuit responding and the component being switched off.

After a cooling phase, the semiconductor switching element can either be switched on again ("retry" operation) from the outside, for example using a microcontroller, or the intelligent semiconductor switching element is designed in such a manner that it switches itself on again ("restart" operation) after cooling when a prescribed temperature has been undershot.

Semiconductor bodies or semiconductor chips in which such intelligent power components are integrated are usually surrounded by a housing which comprises a molding compound and from which connection legs for contact-connecting the semiconductor component project. Connections, for example bonding wires, are present within the housing between contact zones of the semiconductor body and the connection legs. Permanently switching the power component in a cyclic manner, for example in the event of the load being shorted for a relatively long time, results in thermomechanical stress in the bonding wires and particularly in the transition region between the contact zone and the bonding wire. This thermomechanical stress can result in material fatigue and cracks in the contact zone which is, for example, a metallization which has been applied to the semiconductor body. As a result, the contact resistance between the bonding wire and the contact zone or the contact zone's resistance increases, with the result that the semiconductor body may be severely overheated in this transition region. In the case of power MOSFETs, severe overheating of the semiconductor body may result in the semiconductor body breaking down between the source and drain, with the result that the power component is permanently on even if the gate electrode is not being driven. A comparatively high forward resistance of the component in this damaged state results in a high power loss which is converted into heat and, in extreme cases, may damage surrounding components or a printed circuit board to which the component has been applied. This may have serious consequences for the loads which are connected to the power component.

In order to solve this problem, it is known practice to limit the maximum permissible number of switching-on and switching-off cycles and to completely prevent the component from being driven after this maximum number of cycles has been reached.

Furthermore, the robustness of the components can be enhanced by using as many bonding wires as possible to connect the contact zone to the contact element which is accessible, on the housing, from the outside.

In addition, the temperature value at which the component is switched off on account of overheating can be reduced in order to reduce the thermal stress. Since, however, the nominal current generally determines the maximum permissible power loss of the component during short-circuit operation, the power density can only be reduced by increasing the active component area of the power component, which, however, is not economically viable.

In addition, the temperature sensor which detects the temperature in the component and causes the component to be switched off in the event of an overtemperature could be optimized to the effect that it is positioned in such a manner that the thermal contact resistance between the "hottest" regions in the semiconductor component and the temperature sensor is as small as possible so that the temperature sensor detects the component temperature immediately, as far as possible, in order to keep a delay time between the occurrence of the overtemperature and the response of the sensor as short as possible.

SUMMARY

It is an aim of the present invention to provide a component arrangement having a semiconductor body, a semiconductor component which is integrated in the semiconductor body, a contact zone which is applied to the semiconductor body and a contact element which is connected to the contact zone by means of a connection, in the case of which component arrangement wear on the contact zone and/or on the connection, in particular on account of thermal stress, can be reliably detected.

The component arrangement according to the invention comprises a semiconductor body having at least one semiconductor component which is integrated in the semiconductor body and has at least one first connection zone, a first contact zone which is applied to the semiconductor body and contact-connects the at least one first connection zone in an electrically conductive manner, and a contact element which is connected to the contact zone in an electrically conductive manner by means of at least one connection. In this case, the at least one contact zone has at least two contact zone sections which are arranged at a distance from one another and are each connected to the contact element in an electrically conductive manner by means of at least one connection, an evaluation circuit being connected to the two contact zone sections.

In this case, the connections which connect the contact zone sections to the contact element are, in particular, bonding wires. The contact element is, for example, a connection leg or a connection clip which projects, at one end, from a housing which surrounds the semiconductor body and the connections. The contact zone is, for example, a metallization layer which is applied to the semiconductor body in a sufficiently well-known manner such that it contact-connects the first connection zone of the semiconductor component in an electrically conductive manner. The semiconductor component is, in particular, a power MOSFET or a power IGBT, the first connection zone being the source zone of the component, for example, in this case.

The present invention makes use of the knowledge that, when there are a plurality of connections between the contact element and the contact zone of the semiconductor body, damage to the connection or damage in the transition region between the connection and the contact zone on account of thermal stress does not usually occur at all of the connections at the same time but rather only gradually. There may thus already be damage at one or more connections, while the other connections or the junctions between these other connections and the contact zone are still intact. If there are now two contact zone sections which together form a contact zone and are each connected to a contact element by means of connections, and if the connection between one of these contact zone sections and the contact element has been damaged on account of thermal stress, while the other connection is still intact, a potential difference (which is evaluated by the evaluation circuit) can be tapped off at these two contact zone sections when current flows through the component. If this potential difference exceeds a prescribed maximum value, this indicates temperature-induced wear on one of the connections, which wear requires suitable measures, in particular permanent deactivation of the component.

The evaluation circuit may be designed to output a wear signal which indicates detected wear on the component. This wear signal may be used internally in the component arrangement to prevent the semiconductor component from being driven further in a conductive manner. In addition, the wear signal may also be output by the component arrangement in order to use an external drive circuit, which drives the semiconductor component, to prevent further driving or, if appropriate, to interrupt a voltage supply to the circuit in which the "worn" component is connected.

The maximum value of the potential difference determined between the contact zone sections by the evaluation circuit is dependent, in particular, on the load current flowing through the component. In one embodiment, provision is therefore made for a current measurement signal to be supplied to the evaluation circuit in order to take into account the load current flowing through the component when generating the wear signal. This current measurement signal may be provided by a current measuring arrangement which is sufficiently well known and is integrated in intelligent power components anyway.

The semiconductor component and the evaluation circuit may be integrated together in a semiconductor body, it being possible for the evaluation circuit to be part of the "intelligent" control circuit, in particular, in the case of intelligent power components. In addition, it goes without saying that it is also possible to integrate the semiconductor component and the evaluation circuit in different semiconductor bodies, it being possible for these different semiconductor bodies to be arranged using chip-on-chip technology or chip-by-chip technology, for example, and to be integrated in a common housing.

Any desired semiconductor components which have at least two load connections, in particular power MOSFETs, power IGBTs, power thyristors or power diodes, and are integrated in a semiconductor body having a contact zone for the purpose of contact-connecting active component regions of the semiconductor component are suitable as the semiconductor component for the component arrangement according to the invention. In order to implement the invention, it is necessary to subdivide the existing contact zone into only two contact zone sections and to provide an evaluation circuit which may be in the form of a fully integrated circuit and may thus be implemented with little outlay.

BRIEF DESCRIPTION OF THE DRAWINGS

The present invention will be explained in more detail below with reference to figures.

FIG. 1 shows a plan view of a component arrangement according to the invention having a semiconductor component in the form of a power MOSFET.

FIG. 2 shows a side view of the component arrangement shown in FIG. 1 in a sectional plane A-A depicted in FIG. 1.

FIG. 7 shows a side view (FIG. 7a) and a plan view (FIG. 7b) of an exemplary embodiment of a component arrangement according to the invention in which a semiconductor body having a semiconductor component and a further semiconductor body having an evaluation circuit are arranged using chip-on-chip technology.

FIG. 8 shows an exemplary embodiment of an evaluation circuit.

In the figures, unless otherwise specified, identical reference symbols denote identical component parts and signals with the same meaning.

DETAILED DESCRIPTION

Figure 3:
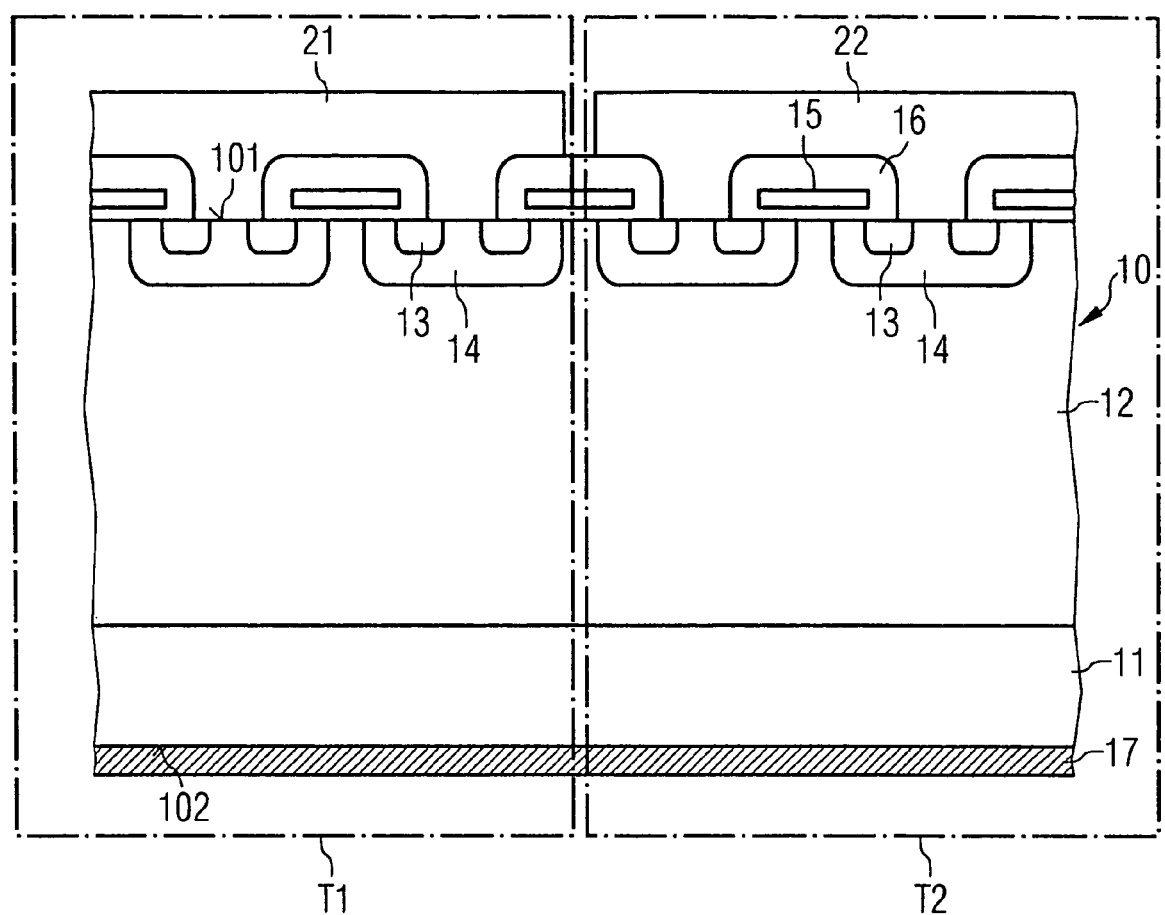
FIG. 3 shows, in detail form, a cross section through a semiconductor body of the component arrangement, the power MOSFET being integrated in said semiconductor body.

FIG. 1 shows a plan view of a first exemplary embodiment of a component arrangement according to the invention. A side view of this component arrangement is illustrated in FIG. 2 along the sectional plane A-A depicted in FIG. 1.

In the exemplary embodiment illustrated, the component arrangement has a semiconductor body 10 in which a vertical power MOSFET is integrated. The fundamental design of this power MOSFET will be explained below with reference to FIG. 3. The semiconductor body 10 has a front side 101 and a rear side 102 and is applied, by way of its rear side 102, to a chip carrier (leadframe) 30. The drain connection of this power MOSFET is situated in the region of the rear side 102 of the semiconductor body 10 and is connected to the chip carrier 30 in an electrically conductive manner. Integrally formed on the chip carrier 30 is a first connection leg 31 which projects from a housing 70 (which is illustrated using a dash-dotted line in FIG. 1 and surrounds the chip carrier 30 and the semiconductor body) in order to be able to contact-connect the drain connection of the power MOSFET from the outside by means of this connection leg 31.

The source zone of the power MOSFET is situated in the region of the front side 101 and is contact-connected by a contact zone 21, 22 having two contact zone sections 21, 22 which are arranged at a distance from one another. A contact element 32 which projects, at one of its ends, from the housing 70 is used to contact-connect the source zone of the power MOSFET from the outside. This contact element 32 is connected to the contact zone sections 21, 22 by means of connections 41, 42 which are implemented in the form of bonding wires, for example. In this case, a first contact zone section 21 of the contact zone sections 21, 22 is connected to the contact element 32 by means of a first connection 41 and a second contact zone section 22 of the contact zone sections 21, 22 is connected to the contact element 32 by means of a second connection 42.

The contact zone sections 21, 22 are, for example, in the form of a metallization layer, in particular made of aluminum, and are applied above the front side 101 of the semiconductor body 10. A passivation layer, which covers this metallization 21, 22, and connection windows in this passivation layer, by means of which the bonding wires 41, 42 contact-connect the contact zone sections 21, 22, are not illustrated in the figures.

A gate connection zone 23 of the power MOSFET is likewise present in the region of the front side 101 of the semiconductor body 10 and is connected to a further connection leg 33, which projects, at one end, from the housing 70, by means of a further connection 43, for example a bonding wire.

An evaluation circuit 50 which is connected to the contact zone sections 21, 22 is present according to the invention. This evaluation circuit 50 is merely illustrated as a function block in FIG. 1 using a dashed line. The design and method of operation of this evaluation circuit 50 will be explained below. Electrically conductive connections 61, 62 which are used to connect the evaluation circuit 50 to the contact zone sections 21, 22 are likewise illustrated only diagrammatically in FIG. 1.

During operation of the component, that is to say when current is flowing between the drain and the source of the power MOSFET, the evaluation circuit 50 is used to detect a potential difference between the contact zone sections 21, 22 and to generate a wear signal S50 on the basis of the potential difference determined. This wear signal is available, for example, at a further contact element 34 which is accessible from the outside and is connected to a contact zone 24 of the evaluation circuit 50 by means of a further connection 44.

Subdividing the source contact zone into the two contact zone sections 21, 22 causes part of the load current, which flows through the power component, to flow to the contact element 32 via the first contact zone section 21 and the first connection 41 and part of the load current to flow to the contact element 32 via the second contact zone section 22 and the second connection 42. If the contact resistance between one of the connections 41, 42 and the respective contact zone section 21, 22 now increases, if the resistance of the connections 41, 42 increases or if the resistance of one of the metallic contact zone sections 21, 22 increases, for example as a result of cracking owing to thermal stress, this results in a potential difference which can be tapped off between the two contact zone sections 21, 22 and which is evaluated by the evaluation circuit 50.

In order to improve understanding, FIG. 3 shows a detail of the semiconductor body 10 in which the power MOSFET is integrated. In the region of its rear side 102, the semiconductor body 10 has a drain zone 11 which is contact-connected, for example, by a drain metallization 17. In the direction of the front side, this drain zone 11 is adjoined by a drift zone 12 which is doped more weakly than the drain zone 11. A cell array having body zones 14 (which are doped in a complementary manner to the drift zone 12) and source zones 13 is present in the drift zone 12 in the region of the front side 101, the body zones 14 separating the source zones 13 and the drift zone 12 from one another. A gate electrode 15 which is insulated from the semiconductor body by means of an insulation layer 16 and is arranged above the front side 101 of the semiconductor body 10 in the exemplary embodiment is provided in order to form a conductive channel in the body zones 14 between the source zones 13 and the drift zone 12.

In the case of an n-conducting MOSFET, the drain zone 11, the drift zone 12 and the source zone 13 are n-doped, while the body zone 14 is p-doped. In the case of a p-conducting MOSFET, these semiconductor zones are each doped in a complementary manner. In the case of an IGBT, the semiconductor zone 11 which is arranged in the region of the rear side is p-doped and forms the p-type emitter of said IGBT, the semiconductor zone 12 is n-doped and forms the n-type base of said IGBT, the semiconductor zone 14 is p-doped and forms the p-type base of said IGBT and the semiconductor zone 13 is n-doped and forms the n-type emitter of said IGBT.

Some of the transistor cells of the component (said transistor cells each having a source zone 13, a body zone 14, a common drift zone 12 and a common drain zone 11) are contact-connected by the first contact zone section 21, while other transistor cells are contact-connected by the second contact zone section 22. In the exemplary embodiment, the contact zone sections 21, 22 short the source zone 13 and the body zones 14 in a known manner. However, it is also possible for the contact zone sections 21, 22 to respectively contact-connect only the source zones 13.

The transistor cells which are contact-connected by the first contact zone section 21 form a first transistor T1 and the transistor cells which are contact-connected by the second contact zone section form a second transistor T2, these two transistors T1, T2 having a common drain connection and a common gate electrode but, in the form of the contact zone sections 21, 22, having separate source connections which are only routed to a common contact element 32 via the connections 41, 42 (FIG. 1).

Figure 4:
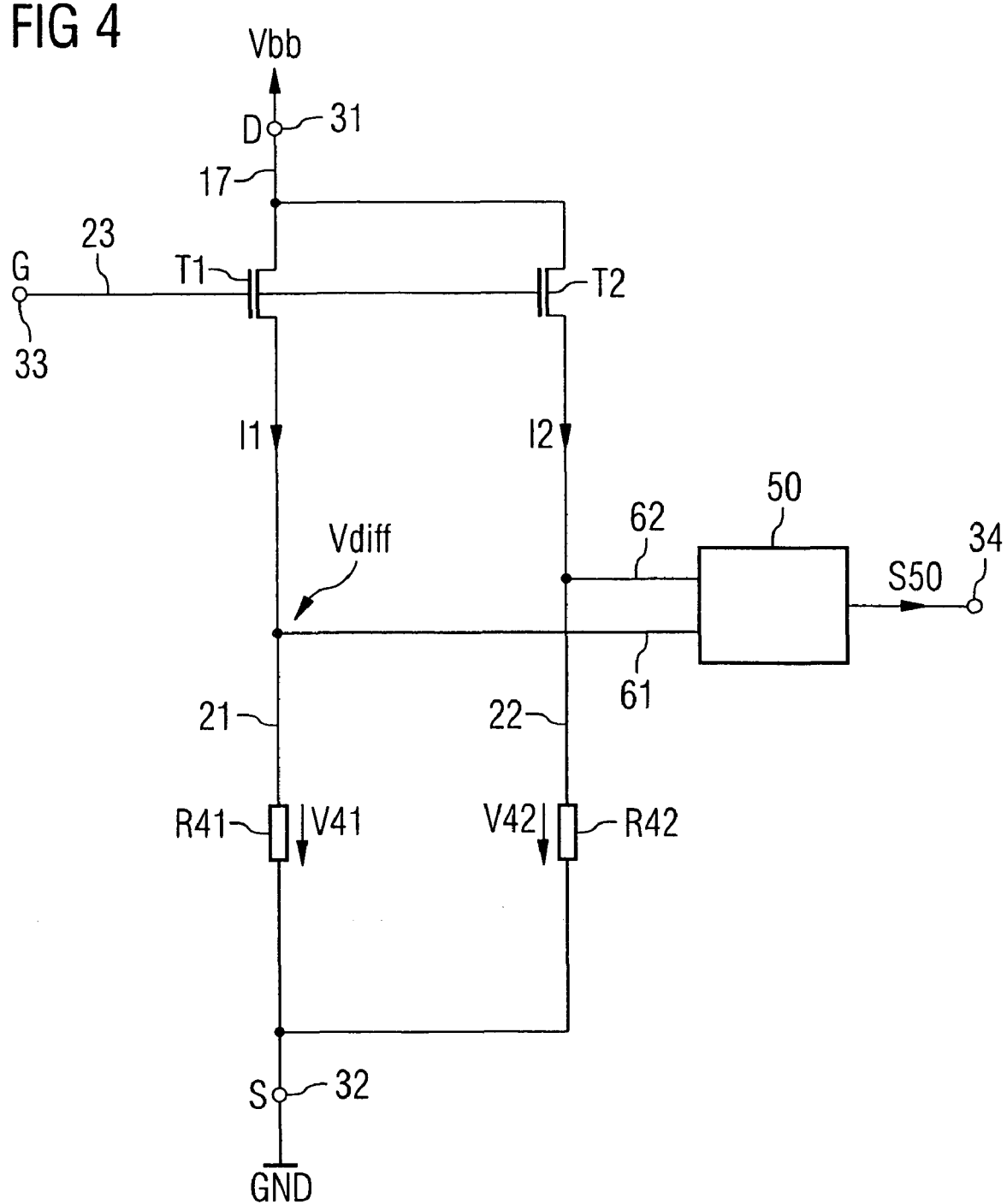
FIG. 4 shows the electrical equivalent circuit diagram for a component arrangement in accordance with a first exemplary embodiment.

FIG. 4 shows the electrical equivalent circuit diagram of the component arrangement which was explained with reference to FIGS. 1 to 3, the reference symbols used in FIGS. 1 to 3 being used for corresponding connections in FIG. 4.

The equivalent circuit diagram shows the first and second transistors T1, T2 which have a common gate connection G and a common drain connection D. Referring to FIG. 1, the gate connection G can be contact-connected from the outside via the contact element 33 and the drain connection can be contact-connected from the outside via the contact element 31 which is formed on the chip carrier 30. In the equivalent circuit diagram, a first nonreactive resistance R41 is in series with the drain-source path D-S of the first transistor T1 and a second nonreactive resistance R42 is in series with the drain-source path D-S of the second transistor T2, said resistances being jointly connected to the source contact S of the semiconductor component. Referring to FIG. 1, this source contact S is formed by the connection leg 32.

The first resistance R41 represents the sum of the following resistances: the nonreactive resistance between the first contact zone 21 and the source zones connected thereto, the nonreactive resistance of the contact zone 21 itself, the contact resistance between the first contact zone section 21 and the first connection 41 and the resistance of the first connection 41. The second nonreactive resistance R42 represents the sum of the corresponding resistances of the second contact zone section 22 and of the second connection 42.

By way of example, the power component is subdivided into the first and second transistors T1, T2 in such a manner that the same number of transistor cells are contact-connected by the first contact zone section 21 and the second contact zone section 22. When a voltage is applied between the drain connection D, 31 and the source connection S, 32 and a drive potential is applied to the gate connection G, 33, the same load currents I1, I2 then respectively flow through these two transistors T1, T2. If the connection resistances R41, R42 are the same, the voltage drops V41, V42 across these connection resistances R41, R42 are then the same, with the result that the contact zone sections 21, 22 are at the same potential and a differential voltage Vdiff=0 can thus be tapped off between the contact zone sections 21, 22.

As already explained, the evaluation circuit 50 is connected to these contact zone sections 21, 22 in an electrically conductive manner by means of electrically conductive connections 61, 62 in order to evaluate this differential voltage Vdiff and output a wear signal S50 on the basis of the differential voltage Vdiff determined.

If, on account of repeated thermal stress, wear on one of the contact zone sections 21, 22 or on one of the connections 41, 42 results or the contact resistance between one of the connections 41, 42 and the respective contact zone section 21, 22 increases, the respective connection resistance R41 or R42 increases, with the result that the voltage drop V41, V42 across the respective connection resistance increases and the voltage difference Vdiff turns out to be not equal to zero. In the example, the following applies to this voltage difference:

$$Vdiff = I2 \cdot R42 - I1 \cdot R41 \quad (1).$$

When the load currents I1, I2 are the same, the evaluation circuit 50 only needs to determine whether the magnitude of the potential difference Vdiff exceeds a prescribed threshold value.

FIG. 8 shows an exemplary embodiment of such an evaluation circuit. This evaluation circuit comprises a first comparator 51 which determines whether the potential at the second contact zone section 62 is higher than the potential at the first contact zone section 21 by more than a reference value. A second comparator 52 determines whether the potential at the first contact zone section 21 is higher than the potential at the second contact zone section 22 by more than the reference value. Output signals from the comparators 51, 52 are supplied to an OR gate which provides the wear signal S50, this wear signal assuming a high level in the example if one of the potentials at one of the contact zone sections is higher than the potential at the other contact zone section by more than the reference value.

It goes without saying that a wear signal can also be determined using the potential difference Vdiff when the two transistors T1, T2 have different channel widths, that is to say when a different number of transistor cells are contact-connected by the contact zone sections 21, 22. Since, in the case of different channel widths and the same drive conditions, different load currents through the two transistors T1, T2 result, a potential difference Vdiff that is not equal to zero is present in this case even if the connection resistances R41, R42 are the same. In this case, this potential difference Vdiff is evaluated in the evaluation circuit 50 taking into account the known channel widths WT1, WT2 of the first and second transistors T1, T2. In this case, the following applies to the potential difference Vdiff:

$$Vdiff = WT2 \cdot R42 - WT1 \cdot R41 \quad (2).$$

Since, in this case, a potential difference Vdiff that is not equal to zero is always present even if the connection contacts are not damaged, information about the load current flowing through the component is advantageously concomitantly taken into account in the evaluation circuit 50.

Figure 5:
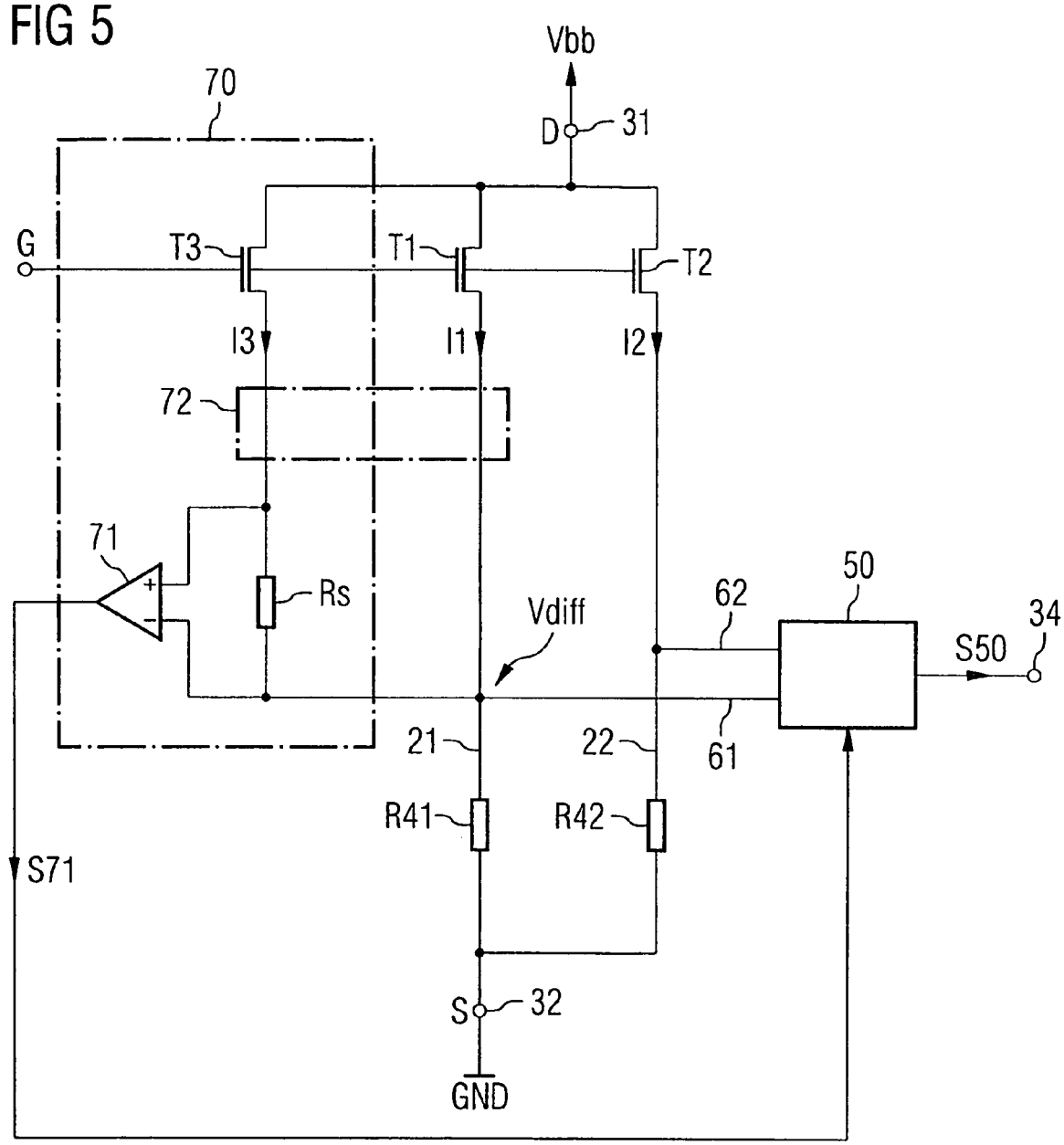
FIG. 5 shows an electrical equivalent circuit diagram of the component arrangement for a second exemplary embodiment.

FIG. 5 shows the equivalent circuit diagram of a component arrangement according to the invention in which there is a current measuring arrangement 70 which provides a current measurement signal S70 that is proportional to the load current flowing through the component. In the exemplary embodiment, this current measuring arrangement 70 is in the form of a so-called current sense arrangement and comprises a third transistor T3 whose drain connection is connected to the drain connections of the first and second transistors T1, T2, whose gate connection is connected to the gate connections of the first and second transistors T1, T2 and whose source connection is connected, via a current measuring resistance Rs, to the source connection of the first transistor T1 and to the first contact zone section 21. If this third transistor T3 is subject to the same drive conditions as the first and second transistors T1, T2, a load current I3 which is proportional to the load currents I1, I2 through the two other transistors T1, T2 flows through the third transistor T3, the following applying:

$$I3 = WT3/WT1 \cdot I1 = WT3/WT2 \cdot I2 \quad (3).$$

In this case, WT3 denotes the channel width or the active transistor area of this third transistor T3. The load current I3 through this third transistor T3 gives rise to a voltage drop Vs across the current measuring resistance Rs, said voltage drop being detected using an amplifier 71, and the current measurement signal S70 which is supplied to the evaluation circuit 50 being available at the output of this amplifier.

If the measuring resistance Rs is selected in such a manner that the voltage across the measuring resistance Rs is very small, it can be assumed that the transistor T3 is operated at the same operating point as the transistors T1 and T2. If appropriate, a control arrangement 72 which is known in principle and is merely indicated in FIG. 5 using a dashed line may be provided the current measuring arrangement 70, said control arrangement ensuring that the transistor T3 is operated at the same operating point as the transistor T1.

In the exemplary embodiment shown in FIG. 5, the following applies to the differential voltage Vdiff:

$$Vdiff = [I3 \cdot (R41 \cdot (WT1 + WT3) - R42 \cdot WT2)]/WT3 \quad (4).$$

Knowing the current I3 (which is used as the differential current) through the third transistor T3 and knowing the transistor widths WT1, WT2, WT3 makes it possible to use this differential voltage Vdiff to determine whether the ratio of the connection resistances R41, R42 exceeds a prescribed threshold value or undershoots a prescribed threshold value, which could indicate thermal-stress-induced wear on one of the connection zones.

Dividing the source connection into contact zone sections 21, 22 which contact-connect transistor elements T1, T2 having different channel widths can be advantageous in this respect because the size of the transistor which is contact-connected by the respective contact zone section influences the aging process. In the case of contact zone sections 21, 22 having the same area, it is true in this case that the section 21, 22 which contact-connects the larger transistor that is thus subject to a higher current density during operation is subject to a more rapid aging process. As already explained, the voltage which can be tapped off between the contact zone sections 21, 22 and changes to this voltage are particularly pronounced over time if the resistances of the contact zone sections 21, 22 become very different on account of a different aging process.

In the exemplary embodiment shown in FIG. 1, the evaluation circuit 50 is connected to the contact element 34 in order to pass the wear signal S50 to the outside where it can be supplied to a drive circuit (not illustrated) for the semiconductor component, said drive circuit preventing the semiconductor component from being driven further if the wear signal S50 indicates wear on one of the connections 41, 42 or contact zones.

It goes without saying that it is also possible to use this wear signal only internally in the semiconductor component in order to prevent driving when thermal-stress-induced wear is detected.

The evaluation circuit 50 may be integrated in the same semiconductor body 10 in which the power semiconductor component is also integrated.

In addition, referring to FIG. 7, it is also possible to integrate the power semiconductor component and the evaluation circuit in different semiconductor chips. FIG. 7 shows a side view (FIG. 7*a*) and a plan view (FIG. 7*b*) of a component arrangement having a first semiconductor chip 111 which is applied to a chip carrier 30 and in which the power semiconductor component is integrated. Two contact zone sections 21, 22 which are connected to a first contact element 32 by means of connections 41, 42 are applied to the front side of the first semiconductor chip 111. Applied to this first semiconductor chip 111 is a second semiconductor chip 112 in which the evaluation circuit 50 is integrated and which is connected to the contact connection zones 21, 22 by means of connections 611, 621, in particular bonding wires, in order to detect, in the evaluation circuit 50, a potential difference between the contact connection zones 21, 22. The evaluation circuit 50 is connected to a further contact element 34 by means of a further connection 44 in order to deliver a wear signal to the outside, if appropriate.

The reference symbol 23 in FIG. 7 denotes a gate connection zone, the reference symbol 43 denotes a connection and the reference symbol 33 denotes a further contact element in the form of a connection leg or connection clip.

Although the present invention has been hitherto described with reference to a vertical component, it should be pointed out that the invention is, of course, not restricted to vertical components. Instead of the vertical MOSFET in FIG. 1, a lateral MOSFET having a drain connection on the front side could likewise be provided, it being possible for the drain connection to be connected to a drain connection leg by means of a further bonding wire. Only the fact that the contact zone of a load connection is subdivided into two sections which are connected separately to a connection electrode is essential to the invention.

Figure 6:
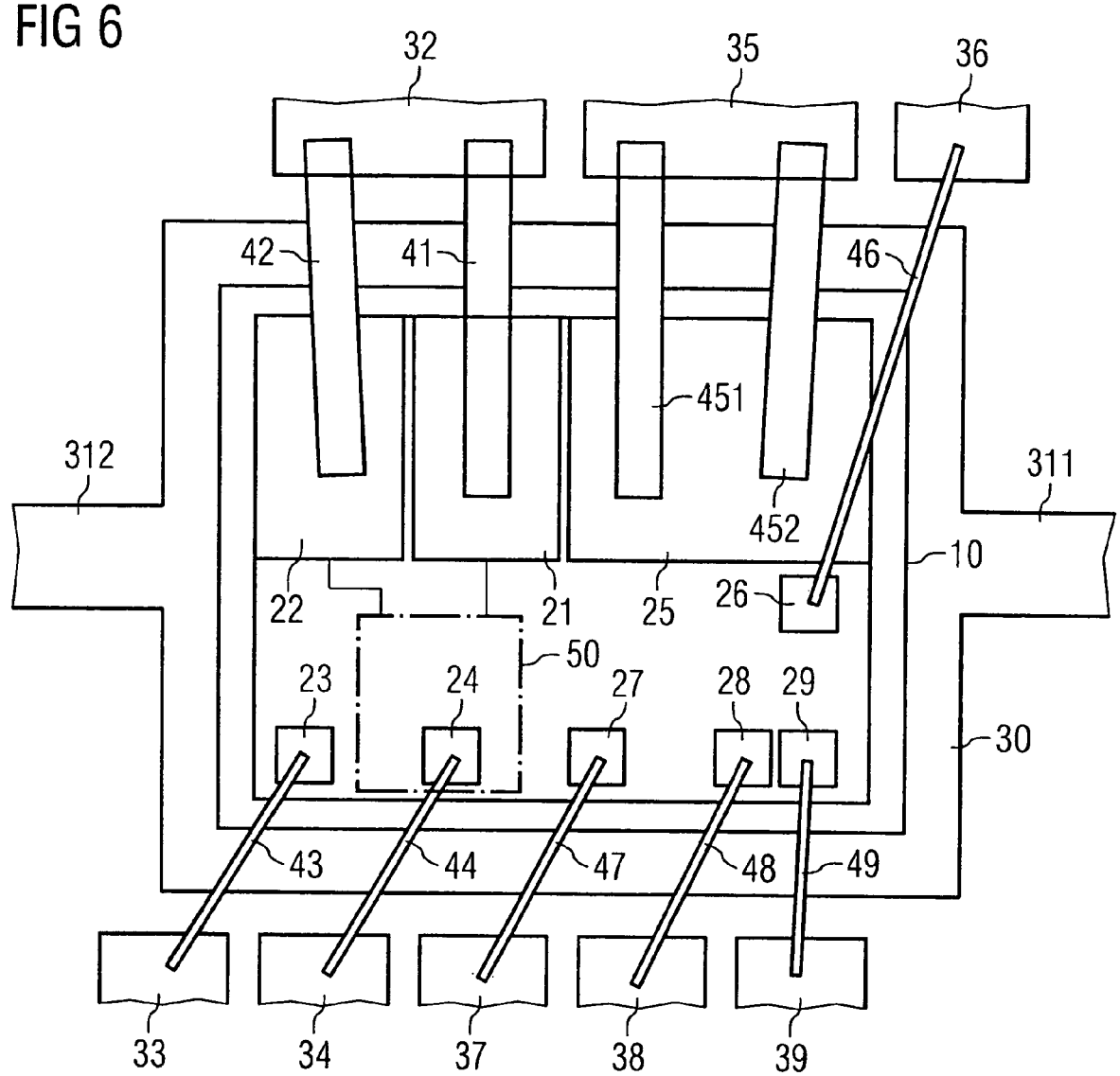
FIG. 6 shows a plan view of a component arrangement according to the invention which has a semiconductor body having two power MOSFETs which are integrated in the semiconductor body.

Referring to FIG. 6, it is also possible to integrate two power components, in particular two power MOSFETs, in the semiconductor body 10. FIG. 6 shows a plan view of such a component arrangement which essentially differs from that illustrated in FIG. 1 by virtue of the fact that a further power MOSFET having a source contact zone 25 which is connected to a contact element 35 (which is accessible from the outside) by means of connections 451, 452 is integrated in the semiconductor body 10. 24 and 34 are used, in FIG. 6, to denote a connection contact and an associated connection leg of a diagnosis circuit which evaluates the potential difference between the contact zone sections 21, 22.

23 and 33 are used, in FIG. 6, to denote, for example, the gate contact and the associated connection leg of one of the transistors.

In addition to immediately routing the gate connections out of the component via connection legs, it is also possible to provide suitable drive or driver circuits for the transistors on the chip, said drive or driver circuits driving the gate connections of the transistors on the chip. The connections (the connections 33 and 36-39 in the example) which are routed out of the housing to the outside in addition to the load connections 311, 312 and 32, 35 are then logic connections which are used to supply drive signals to the component and, for example, to route diagnostic signals out of the component to the outside. In the case of the component shown in FIG. 6, the connections 33, 37 are thus, for example, inputs for supplying input signals to a drive circuit for the transistors, while the connections 37, 38, 39 are, for example, diagnosis outputs which are used, for example, to signal an overtemperature or overloading of the components to the outside.

In the component arrangement illustrated in FIG. 6, only the source contact zone which is arranged on the top side of the semiconductor body 10 is divided in two and has two contact zone sections 21, 22 which are connected to the evaluation circuit 50. It goes without saying that it is also possible to divide the contact zone section 25 of the second power MOSFET in two and to provide, for this second power MOSFET, a further evaluation circuit for detecting temperature-induced wear. In the exemplary embodiment, the component carrier 30 has two integrally formed contact sections 311, 312 which are arranged on opposite sides of the component carrier 30.

The present invention has been described with reference to a component arrangement having a power MOSFET as the semiconductor component. However, it goes without saying that the invention can be applied to any desired power components which are integrated in a semiconductor body that has a contact zone for contact-connecting a load connection of this power component. The disclosed embodiments advantageously includes a contact zone which contact-connects the load connection of the semiconductor component and has two contact zone sections which are connected to a common contact element by means of at least one respective connecting element and includes an evaluation circuit which determines a potential difference between the two contact zone sections in order to provide a wear signal on the basis of the potential difference determined.

The invention claimed is:

1. A component arrangement comprising:
a semiconductor body having a semiconductor component which is integrated in the semiconductor body and a first connection zone for the semiconductor component, a contact zone applied to the semiconductor body that contact-connects the first connection zone in an electrically conductive manner, wherein the contact zone has a first and a second contact zone section which are arranged at a distance from one another, each of the first and the second contact zone sections being contact-connected to the first connection zone,
a housing that surrounds the semiconductor body and the contact zone,
a contact element having a first end and a second end, the first end located within the housing and contact-connected to the first contact zone by a first connection and to the second contact zone by a second connection in an electrically conductive manner, the second end projecting from an exterior of the housing to provide a contact-connection for the semiconductor component, and an evaluation circuit located within the housing that is connected to the first contact zone section by a third connection and to the second contact zone section by a fourth connection, the evaluation circuit configured to compare electrical potentials at the first and the second contact zone sections and to generate an evaluation signal on the basis of the comparison result.

2. The component arrangement of claim 1 wherein the evaluation circuit is operably coupled to receive a current measurement signal which provides information about a load current flowing through the semiconductor component.

3. The component arrangement of claim 2 wherein the evaluation circuit generates the evaluation signal taking into account a potential difference which is present between the contact zone sections and the current measurement signal.

4. The component arrangement of claim 3 wherein the connections are bonding wires.

5. The component arrangement of claim 3 wherein the semiconductor component which is integrated in the semiconductor body is a transistor or thyristor, the connection zone being one of the load connection zones of the semiconductor component.

6. The component arrangement of claim 3 wherein the semiconductor component which is integrated in the semiconductor body is a diode.

7. The component arrangement of claim 3 wherein the evaluation circuit and the at least one semiconductor component are integrated in a common semiconductor body.

8. The component arrangement of claim 3 wherein the evaluation circuit and the at least one semiconductor component are integrated in different semiconductor bodies.

9. The component arrangement of claim 1 wherein a current measurement signal which provides information about a load current flowing through the semiconductor component is supplied to the evaluation circuit.

10. The component arrangement of claim 9 wherein the evaluation circuit is designed to generate the evaluation signal taking into account a potential difference which is present between the contact zone sections and the current measurement signal.

11. The component arrangement of claim 10 wherein the evaluation circuit and the at least one semiconductor component are integrated in a common semiconductor body.

12. The component arrangement of claim 10 wherein the evaluation circuit and the at least one semiconductor component are integrated in different semiconductor bodies.

13. The component arrangement of claim 3 wherein the evaluation circuit is designed to generate the evaluation signal taking into account a potential difference which is present between the contact zone sections and the current measurement signal.

14. The component arrangement of claim 13 wherein the connections are bonding wires.

15. The component arrangement of claim 13 wherein the evaluation circuit and the at least one semiconductor component are integrated in a common semiconductor body.

16. The component arrangement of claim 13 wherein the evaluation circuit and the at least one semiconductor component are integrated in different semiconductor bodies.

17. A semiconductor component arrangement comprising:
a semiconductor body;
a power semiconductor component having a load connection and being integrated in the semiconductor body;
a contact zone electrically coupled to the load connection of the power component, the contact zone including a first contact zone section and a second contact zone section spaced apart from the first contact zone section with each of the first and the second contact zone sections being electrically coupled to the load connection;
a common contact element electrically coupled by a first connecting element to the first contact zone section and by a second connecting element to the second contact zone section;
an evaluation circuit electrically coupled by a third connecting element to the first contact zone connection and by a fourth connecting element to the second contact zone section, the evaluation circuit being configured to determine a potential difference between the first and second contact zone sections and to provide a wear signal on the basis of the potential difference determined,
wherein the evaluation circuit and the power semiconductor component are integrated in a common semiconductor body.

18. The semiconductor component arrangement of claim 17 wherein the first and second connecting elements are bonding wires.

* * * * *